(12) United States Patent
Schneider et al.

(10) Patent No.: US 12,261,031 B2
(45) Date of Patent: Mar. 25, 2025

(54) SYSTEM, METHOD AND SUPPORT FOR COATING EYEGLASS LENSES

(71) Applicant: SCHNEIDER GMBH & CO. KG, Fronhausen (DE)

(72) Inventors: Gunter Schneider, Marburg (DE); Markus Fuhr, Erlensee (DE)

(73) Assignee: SCHNEIDER GMBH & CO. KG, Fronhausen (DE)

( * ) Notice: Subject to any disclaimer, the term of this patent is extended or adjusted under 35 U.S.C. 154(b) by 1244 days.

(21) Appl. No.: 16/469,254

(22) PCT Filed: Nov. 16, 2017

(86) PCT No.: PCT/EP2017/079383
§ 371 (c)(1),
(2) Date: Dec. 17, 2019

(87) PCT Pub. No.: WO2018/108426
PCT Pub. Date: Jun. 21, 2018

(65) Prior Publication Data
US 2020/0140994 A1    May 7, 2020

(30) Foreign Application Priority Data

Dec. 14, 2016  (DE) ...................... 10 2016 014 835.7
Dec. 16, 2016  (DE) ...................... 10 2016 014 982.5
Dec. 21, 2016  (DE) ...................... 10 2016 125 273.5

(51) Int. Cl.
*H01J 37/34*    (2006.01)
*C23C 14/34*    (2006.01)
(Continued)

(52) U.S. Cl.
CPC ...... *H01J 37/3417* (2013.01); *C23C 14/3464* (2013.01); *C23C 14/35* (2013.01);
(Continued)

(58) Field of Classification Search
CPC ... C23C 14/352; C23C 14/3464; C23C 14/35; C23C 14/568; C23C 14/505;
(Continued)

(56) References Cited

U.S. PATENT DOCUMENTS 4,226,208 A  * 10/1980  Nishida .................. C23C 14/56
                                                                    118/724
4,816,133 A      3/1989  Barnett
(Continued)

FOREIGN PATENT DOCUMENTS

DE           4010495 A1    10/1991
DE          19501804 A1     7/1996
(Continued)

OTHER PUBLICATIONS

Anonymous, "Optical Parts Process Manual", vol. II, National Defence Industry Press, Beijing, China, Nov. 1977, 10 pages.
(Continued)

*Primary Examiner* — Rodney G McDonald
(74) *Attorney, Agent, or Firm* — Calderon Safran & Wright P.C.; David S. Safran

(57) ABSTRACT

An installation, a carrier, and a method for coating eyeglass lenses are provided, wherein a carrier with eyeglass lenses held in a rotatable manner is conveyed in succession in different coating devices or coating lines, in order to coat in an alternating manner opposite sides of the eyeglass lenses and/or to apply different coatings. In particular, the carriers with the eyeglass lenses are conveyed from a coating device or coating line by an evacuated transfer chamber to another coating device or coating line.

47 Claims, 7 Drawing Sheets

(51) Int. Cl.
*C23C 14/35* (2006.01)
*H01J 37/32* (2006.01)
*C23C 14/50* (2006.01)
*C23C 14/56* (2006.01)
*G02B 1/10* (2015.01)
*G02B 1/11* (2015.01)
*G02B 1/14* (2015.01)
*G02B 1/18* (2015.01)

(52) U.S. Cl.
CPC ...... *C23C 14/352* (2013.01); *H01J 37/32715* (2013.01); *H01J 37/32779* (2013.01); *H01J 37/3405* (2013.01); *H01J 37/3423* (2013.01); *C23C 14/505* (2013.01); *C23C 14/568* (2013.01); *G02B 1/10* (2013.01); *G02B 1/11* (2013.01); *G02B 1/14* (2015.01); *G02B 1/18* (2015.01); *H01J 37/32899* (2013.01); *H01J 37/347* (2013.01); *H01J 2237/20214* (2013.01)

(58) Field of Classification Search
CPC ........... H01J 37/32715; H01J 37/32779; H01J 37/32899; H01J 37/3405; H01J 37/3417; H01J 37/347; H01J 37/3423; H01J 2237/20214; G02B 1/10; G02B 1/11; G02B 1/18; G02B 1/14
USPC .................. 204/192.26, 298.25; 118/719
See application file for complete search history.

(56) References Cited

U.S. PATENT DOCUMENTS

| | | | |
|---|---|---|---|
| 4,825,808 A * | 5/1989 | Takahashi | ............. C23C 14/568 414/217 |
| 5,106,346 A | 4/1992 | Locher et al. | |
| 5,597,609 A | 1/1997 | Beisswenger et al. | |
| 5,783,055 A | 7/1998 | Kamei et al. | |
| 5,814,195 A | 9/1998 | Lehan et al. | |
| 5,879,519 A | 3/1999 | Seeser et al. | |
| 5,911,861 A | 6/1999 | Dubs et al. | |
| 6,123,814 A | 9/2000 | Dubs et al. | |
| 6,187,159 B1 | 2/2001 | Kamura et al. | |
| 6,206,975 B1 | 3/2001 | Rick et al. | |
| 6,250,758 B1 | 6/2001 | Yoshihara et al. | |
| 6,264,751 B1 | 7/2001 | Kamura et al. | |
| 6,336,999 B1 * | 1/2002 | Lemmer | ............... C03C 17/002 204/192.12 |
| 6,365,010 B1 | 4/2002 | Hollars | |
| 6,416,639 B1 | 7/2002 | De Bosscher et al. | |
| 9,840,373 B2 | 12/2017 | Schneider | |
| 10,424,468 B2 | 9/2019 | DeBosscher et al. | |
| 2001/0017261 A1 | 8/2001 | Walls et al. | |
| 2004/0031442 A1 | 2/2004 | Yamazaki et al. | |
| 2004/0089537 A1 | 5/2004 | Breme | |
| 2004/0182701 A1 | 9/2004 | Miyamura | |
| 2005/0109616 A1 | 5/2005 | Ohta et al. | |
| 2006/0196414 A1 | 9/2006 | Schuhmacher et al. | |
| 2006/0278519 A1 | 12/2006 | Malaszewski et al. | |
| 2008/0127887 A1 | 6/2008 | Leung et al. | |
| 2011/0020623 A1 * | 1/2011 | Mitchell | .................. G02B 1/10 428/212 |
| 2011/0024284 A1 | 2/2011 | Schloremberg et al. | |
| 2011/0127157 A1 | 6/2011 | Bellido-Gonzalez | |
| 2011/0132260 A1 | 6/2011 | Yamazaki et al. | |
| 2012/0315395 A1 | 12/2012 | Kuribe et al. | |
| 2013/0036970 A1 | 2/2013 | Choi et al. | |
| 2013/0061805 A1 | 3/2013 | Jin et al. | |
| 2014/0262752 A1 | 9/2014 | Vergohl et al. | |
| 2015/0053530 A1 | 2/2015 | Schneider | |
| 2016/0189939 A1 | 6/2016 | Deppisch et al. | |
| 2018/0312964 A1 | 11/2018 | Schneider et al. | |

FOREIGN PATENT DOCUMENTS

| | | |
|---|---|---|
| DE | 10145201 C1 | 11/2002 |
| DE | 102013208771 A1 | 11/2014 |
| DE | 10 2013 109 078 A1 | 2/2015 |
| EP | 0723036 A1 | 7/1996 |
| EP | 0913714 A1 | 5/1999 |
| EP | 0928977 A1 | 7/1999 |
| EP | 0945524 A1 | 9/1999 |
| EP | 1101836 A1 | 5/2001 |
| EP | 2280407 A2 | 2/2011 |
| JP | S60204882 A | 10/1985 |
| JP | H06264104 A | 9/1994 |
| JP | H10317135 A | 12/1998 |
| JP | 2001355068 A | 12/2001 |
| JP | 2003-183823 A | 7/2003 |
| JP | 2006131973 A | 5/2006 |
| JP | 2006171204 A | 6/2006 |
| JP | 2008069402 A | 3/2008 |
| JP | 2010199517 A | 9/2010 |
| JP | 2012158835 A | 8/2012 |
| JP | 2013249489 A | 12/2013 |
| JP | 2014074188 A | 4/2014 |
| JP | 2015045087 A | 3/2015 |
| KR | 100519707 B1 | 10/2005 |
| WO | 9323176 A1 | 11/1993 |
| WO | 02/063074 A1 | 8/2002 |
| WO | 03023813 A1 | 3/2003 |
| WO | 2017216065 A1 | 12/2017 |

OTHER PUBLICATIONS

Li, "Vacuum film plating technology and device", Northeastern University of Technology Press, Liaoning Province, China, Oct. 1989, 18 pages.

* cited by examiner

SYSTEM, METHOD AND SUPPORT FOR COATING EYEGLASS LENSES

BACKGROUND OF THE INVENTION

Field of the Invention

The present invention relates to an installation for coating eyeglass lenses and a method for coating eyeglass lenses, as well as a carrier for coating eyeglass lenses.

The present invention relates to the coating of eyeglass lenses preferably by gaseous-phase deposition, in particular by sputtering, which is also referred to as cathode sputtering. In this connection, atoms are removed from a solid, the so-called target, by the impact of high-energy ions, and enter a gaseous phase. In particular, the present invention relates to the so-called magnetron sputtering, in which in addition to an applied electrical field, a magnetic field is also used.

In practice, it is difficult to achieve a uniform, efficient and/or individual and/or adapted coating of the eyeglass lenses to be coated, even though many different devices and methods are known from the state of the art.

Description of Related Art

International Patent Publication WO 2013/131656 A2 and corresponding U.S. Pat. No. 9,840,373 B2 deal with an installation and a method for processing and coating eyeglass lenses. The eyeglass lenses can be selectively conveyed to different devices. Specific requirements for an efficient coating are not discussed in further detail.

German Patent DE 196 06 463 A1 and European Patent EP 0 953 657 A2, and corresponding U.S. Pat. No. 5,783,055 A and 6,206,975 B1, respectively, disclose installations for coating substrates by sputtering, wherein a central handling apparatus in a central chamber is connected to multiple coating devices and wherein the substrates are conveyed from the handling apparatus into the coating devices. The needs of the coating of eyeglass lenses are not discussed in further detail.

German Patent DE 44 07 909 C3 and corresponding U.S. Pat. No. 5,597,609 A, which form the starting point of the present invention, discloses an installation and a method for coating eyeglass lenses, wherein the eyeglass lenses are placed on a rotatable carrier and are conveyed in succession to different coating stations by rotating. Here, no optimal coating of eyeglass lenses is made possible.

SUMMARY OF THE INVENTION

The object of the present invention is to provide an installation, a method, and a carrier for coating eyeglass lenses, wherein a very efficient and/or individual and/or adapted coating and/or a simple, compact and/or cost-efficient design is made possible.

The above object is achieved by an installation, a method, or a carrier as described herein.

According to one aspect of the present invention, a proposed installation with multiple coating devices and a conveying apparatus for conveying eyeglass lenses or a carrier with the eyeglass lenses from a coating device to another coating device is characterized in particular in that the installation has a transfer chamber and in that the coating devices have separate coating chambers, wherein the coating chambers and the transfer chamber form a continuous or interconnecting vacuum system. Thus, a very uniform, efficient and/or individual and/or adapted coating and/or a simple, compact and/or cost-efficient design is made possible.

The preferred vacuum system and/or the preferred linking of all process steps necessary (in a vacuum) for the eyeglass lens coating in an installation and/or a vacuum system results in particular in that no individual steps or intermediate steps are carried out in the atmosphere. In this way, an especially efficient process is made possible, wherein in particular, however, undesirable soiling or the like can also be avoided.

Another, also independently achievable aspect of the present invention is directed toward an installation for coating eyeglass lenses, wherein a carrier for holding two or more eyeglass lenses to be coated is, in succession, conveyed into different in various coating devices and/or accommodated by the latter for coating. To this end, a conveying apparatus is provided, which conveys the carrier from a coating device into another coating device. The coating devices have separate coating chambers and/or are separated or separable from one another by means of locks (or airlocks or sluices). Thus, a very uniform, efficient and/or individual and/or adapted coating is made possible.

Another, independently achievable aspect of the present invention lies in the fact that the eyeglass lenses are coated in succession in different coating devices from opposite sides. In this connection, the carrier is moved in a corresponding manner with the eyeglass lenses to be coated through the coating devices. Thus, in turn, a very uniform, efficient and/or individual or adapted coating can be made possible.

Another, independently achievable aspect of the present invention provides that the carrier is delivered to different coating devices in succession and the eyeglass lenses are coated there, in particular wherein the eyeglass lenses during the coating rotate around their own, thus, separate, axes. Also, in this way, in turn, a very uniform, efficient and/or individual and/or adapted coating can be achieved.

Still another, independently achievable aspect of the present invention lies in the fact that the eyeglass lenses are coated in succession in different coating devices, wherein the carrier with the eyeglass lenses to be coated is conveyed from a coating device to another coating device under negative pressure and/or through an evacuated or evacuatable transfer chamber. In this way, an undesirable and/or excessive aeration of the different coating devices is avoided or at least minimized, and thus an especially efficient coating is achieved.

According to another, independently achievable aspect of the present invention, the eyeglass lenses are firstly provided with a first—in particular functional—coating or basic coating and then with at least one further coating-preferably at least one dielectric layer or multiple different layers, in particular for producing an anti-reflective layer package or for anti-reflection coating and/or for producing mirror coating—in another coating device or coating line, in particular wherein the eyeglass lenses, respectively, are coated in groups of two or four eyeglass lenses and/or wherein the eyeglass lenses are conveyed under negative pressure from the first coating device or coating line to the other coating device or coating line. Thus, in turn, a very uniform, efficient and/or individual and/or adapted coating can be produced.

A proposed method and a proposed installation are characterized especially preferably in that the coating device or coating line for a coating, in particular the further coating, can be selected or is selected from a plurality of coating devices and/or coating lines in particular depending on the availability, technical configuration and/or existing resources.

In particular, an individual and/or adapted coating of eyeglass lenses with high throughput and/or in an interconnecting vacuum system is made possible by the proposed method and the proposed installation. In particular, namely depending on the size and/or shape of the eyeglass lenses, in particular depending on a convex or concave curving of the curvature of the surface(s) to be coated and/or depending on the surface(s) to be coated, the coating is made possible in a correspondingly selected coating device and/or coating line and/or by corresponding adaption of the coating parameters. Thus, a very specific and thus optimized coating of the eyeglass lenses is made possible.

According to another, independently achievable aspect of the present invention, the coating and/or sputtering of the two opposite sides of eyeglass lenses, in particular both convex and concave surfaces or sides of an eyeglass lens, is carried out preferably at the same time or in succession with a pair of sputtering sources and/or targets, respectively. In this way, the production of especially uniform coatings is made possible or facilitated.

According to another, also independently achievable aspect of the present invention, the distance of the sputtering sources, in particular the targets and/or cathodes, which are used in particular in a coating device for coating eyeglass lenses, is used or varied as an adjustment parameter, preferably to achieve an especially uniform coating.

According to another, independently achievable aspect of the present invention, a carrier is proposed for coating eyeglass lenses, preferably by means of gaseous-phase deposition, in particular sputtering, in particular wherein the eyeglass lenses are accessible from opposite sides for two-sided coating and are rotatable around their own axes. Thus, a uniform, efficient and/or individual and/or adapted coating is made possible.

According to another, independently achievable aspect, the carrier is coupled to a toothed rack or a carriage or frame for conveying into and/or through a coating device. This allows in particular a simple and/or cost-efficient design.

Preferably the following generally applies for the previously-mentioned aspects:

Preferably, the coating takes place at least partially by gas deposition, thus in a vacuum, and in particular by sputtering, especially preferably magnetron sputtering.

Especially preferably, the eyeglass lenses are coated in groups of up to 10 eyeglass lenses, in particular two or four eyeglass lenses.

Especially preferably, the eyeglass lenses are coated in different coating devices in succession from opposite sides.

Especially preferably, the carrier is conveyed together with the eyeglass lenses to be coated under negative pressure and/or by means of an evacuated transfer chamber from a coating device or coating line to another coating device or coating line.

Especially preferably, the carrier with the eyeglass lenses to be coated and in particular also together with the carriage and/or frame and/or the toothed rack is completely accommodated by the respective coating device for coating.

Preferably, a predetermined and/or defined, in particular at least essentially vertical orientation of the carrier and/or the lenses is preserved in the coating devices and/or in the installation and/or during movement through the coating devices and/or installation. This is conducive to a compact design, in particular with little space required, and/or a simple handling.

Preferably, a continuous and/or interconnecting vacuum system is formed that comprises in particular multiple coating devices and/or coating chambers, locks, and at least one transfer chamber as well as, if required, one or more receiving stations and/or discharge stations.

In particular, different processing chambers and/or coating devices are combined with optionally different coating technologies to form a single linked system, in particular an interconnecting vacuum system.

Especially preferably, according to another, also independently achievable aspect of the present invention, different coating technologies are combined with one another in a proposed installation and/or in a proposed method, in particular different gaseous-phase deposition methods, such as sputtering, magnetron sputtering, thermal evaporation, CVD coating and/or PVD coating or the like.

Especially preferably, the installation is of modular design, so that depending on longer and shorter coating processes, more or fewer modules and/or units or devices for the respective coatings are combined with one another and/or are combined to form an interconnecting vacuum chamber system.

Especially preferably, for long processes, individual and/or separate coating chambers are used, whereas the same coating chamber can be used multiple times for multiple short processes in succession, so that altogether, an optimal throughput can be achieved.

Especially preferably, the proposed installation and the proposed method make possible a complete coating of an eyeglass lens or an eyeglass lens side, so that all necessary coatings and subsequent surface treatments can preferably be performed in an in particular integrated fashion in one installation.

According to the proposed solution, in particular coatings for anti-reflection coating and/or mirror coating can be applied.

According to the proposed solution, different surface properties can be achieved by corresponding treatment or coating—also referred to as surface finish or end coating—thus, especially preferably oleophobic properties or surfaces, hydrophobic properties or surfaces, and/or so-called anti-fog surfaces, which produce little fog-up. To this end, in particular at least one additional coating device is used for the surface finish and/or the end coating or treatment and is integrated in particular into the vacuum system and/or the installation.

According to the proposed solution, in particular no continuous treatment or coating of the eyeglass lenses is carried out, but rather a separation into different coating processes and/or to different coating devices and/or coating lines is carried out, by which a high flexibility with high throughput is made possible.

According to the proposed solution, in particular an automated coating of eyeglass lenses, especially preferably in succession in different coating devices, is made possible, wherein in particular, an automated and/or optimized operation of and passing-through the different coating devices is made possible.

In particular, the eyeglass lenses are coated in a batch operation, thus, not in a continuous method and/or not continuously, wherein the coating is carried out in particular only in small groups of eyeglass lenses, preferably in groups of individual pairs or multiple pairs of eyeglass lenses, if necessary, however, even of individual eyeglass lenses or any number of eyeglass lenses, especially preferably of up to or fewer than 10 eyeglass lenses.

As already mentioned, this invention relates in particular to the coating of non-flat or curved lenses or glasses, in particular eyeglass lenses. Optionally, the present invention can, however, also be used for other lenses and/or optical components.

The previously-mentioned aspects as well as the features and aspects of the present invention that follow from the further description can be achieved independently of one another, but also in any combination.

Further aspects, advantages, and features of the present invention follow from the claims and the following description of preferred embodiments with reference to the accompanying drawings.

DETAILED DESCRIPTION OF THE INVENTION

In the figures, the same reference numbers are used for the same components and parts, even if a repeated description is omitted.

First, an especially preferred design and an especially preferred mode of operation of a coating device are explained before a proposed carrier and a proposed installation and proposed method for coating are explained in further detail.

Figure 1:
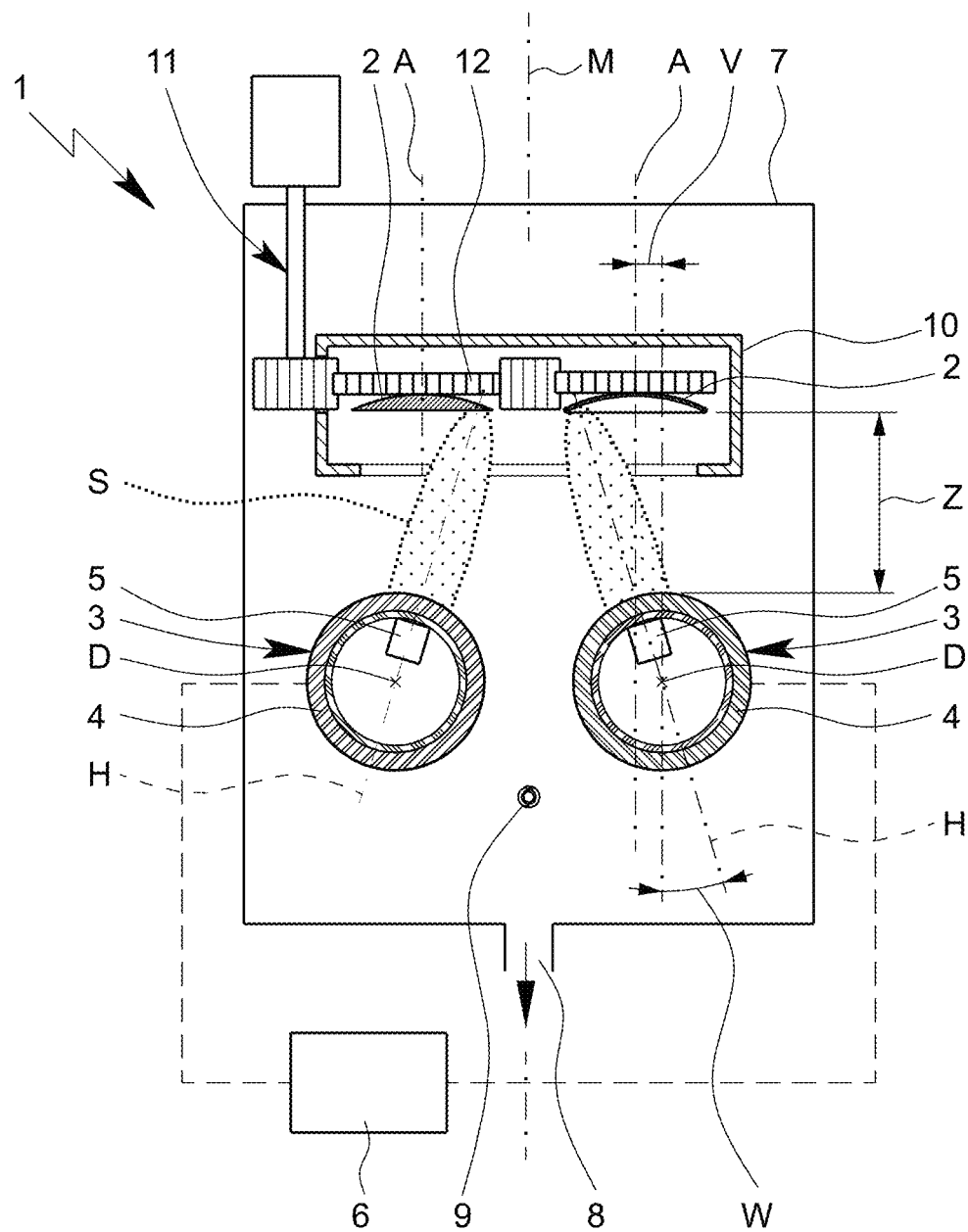
FIG. 1 shows a schematic section of a coating device for coating eyeglass lenses.

In a very schematic sectional view, FIG. 1 shows a coating device 1 for coating eyeglass lenses 2. Below, the latter are also referred to only as lenses. In particular, the coating is carried out namely before an edge working operation for matching to an eyeglass frame or the like.

During coating, the lenses or eyeglass lenses 2 are in particular still disk-like and/or preferably have a defined or uniform diameter. However, the lenses or eyeglass lenses 2 can also have another shape for the coating; for example, in the top view, the lenses can have an elliptical shape or other shape or contour, if applicable even already adapted to an eyeglass frame.

The lenses 2 or uncoated eyeglass lens blanks are preferably produced from plastic or glass.

Below, first an especially preferred design of the coating device 1 is explained in further detail. However, in principle, coating devices 1 that are designed in different ways can also in addition or alternatively be used according to the invention, which will be explained later.

The coating device 1 is preferably designed for coating of the lenses 2 by gaseous-phase deposition, in particular by sputtering, also called cathode sputtering, thus in particular in a vacuum. Especially preferably, a so-called magnetron sputtering is carried out. In addition to an electrically-applied field, in this case a magnetic field is also used and/or applied, which will be explained in somewhat more detail later.

Especially preferably, curved, in particular concave, surfaces of lenses 2 are coated according to the invention. In FIG. 1, such a curved surface is schematically indicated for the lens 2 that is depicted on the right side. However, in principle, also convex surfaces or other surfaces of the lenses 2 can be coated correspondingly.

The coating device 1 preferably has at least one sputtering source 3, here preferably two sputtering sources 3.

The coating device 1 or the respective sputtering source 3 has a target 4, whose material is removed during coating and/or sputtering and—in particular together with other components of the gas atmosphere—forms the desired coating on the respective lens 2 or its surface to be coated.

Figure 2:
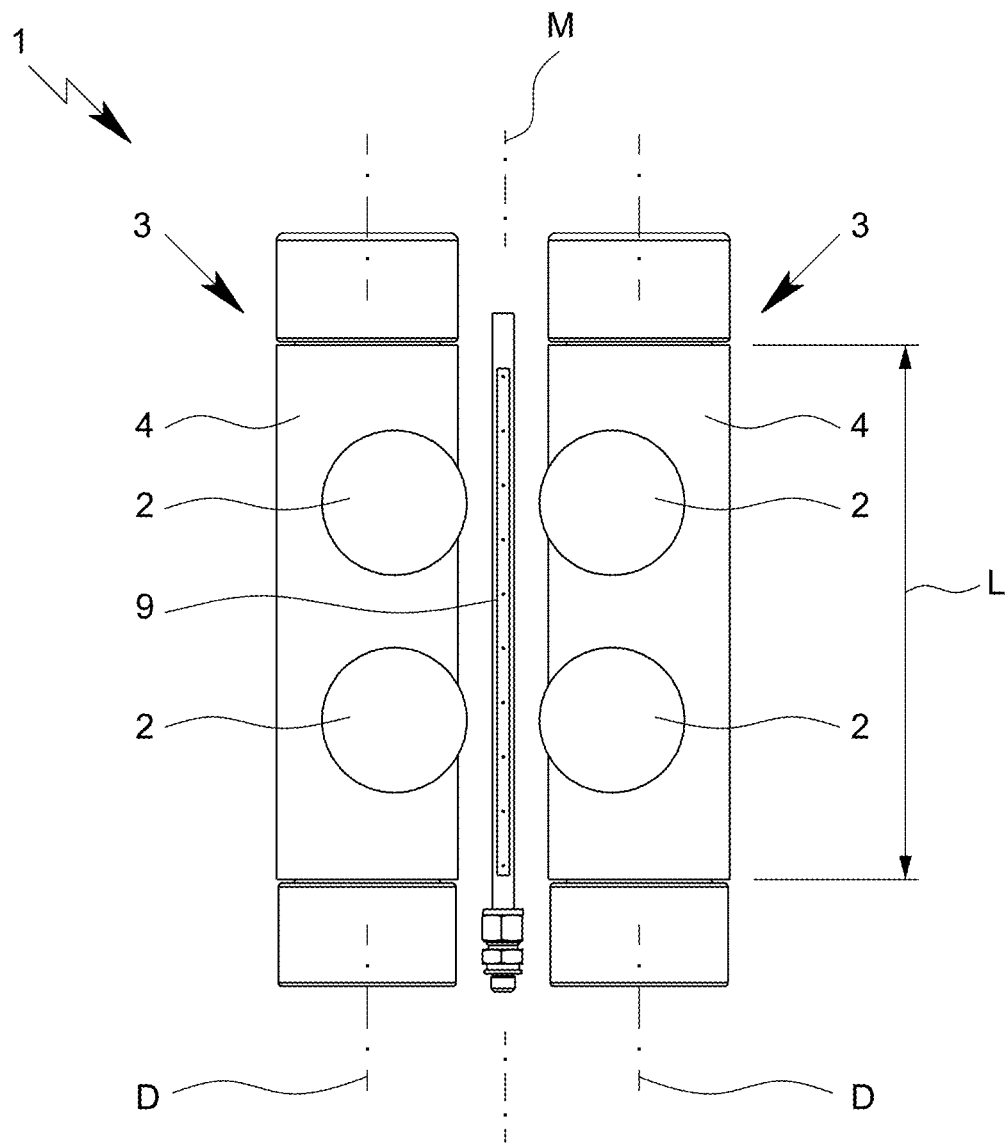
FIG. 2 shows a schematic side view of the coating device.

FIG. 2 shows the coating device 1 and/or sputtering sources 3 in a schematic side view.

In the illustrative example, the sputtering sources 3 and/or targets 4 are preferably designed at least essentially elongated and/or tubular or cylindrical.

The targets 4 are designed in particular as hollow cylinders and/or tubes.

The sputtering sources 3 and/or targets 4 are preferably arranged parallel to one another.

Preferably, the targets 4 can turn or rotate around axes of rotation D. The axes of rotation D preferably run in a common plane and/or in particular parallel to one another, as indicated in FIGS. 1 and 2, but can also alternatively be inclined toward one another. The axes of rotation D preferably correspond to the longitudinal axes of the sputtering sources 3.

Each sputtering source 3 preferably has a magnet arrangement 5, which is assigned to the respective target 4 for producing the already-mentioned magnetic field and thus a directed sputtering cloud S, as schematically indicated in FIG. 1. In particular, the magnet arrangement 5 is arranged below and/or in the respective target 4.

The coating device 1 has a voltage source 6, as indicated in FIG. 1, in order to be able to operate the sputtering sources 3 and/or targets 4 as cathode—in particular alternately—and/or to be able to apply the necessary voltage to the sputtering sources 3 and/or targets 4 for sputtering, in particular in the form of pulses.

Especially preferably, the sputtering sources 3 and/or targets 4 are operated or supplied alternately with direct current (pulses). This is also referred to as "bi-polar DC". Alternately, one sputtering source 3 and/or one target 4 is then used as a cathode, and the other sputtering source 3 and/or the other target 4 is used as an anode.

Alternatively, an operation with alternating current, or some other operation can be carried out.

Alternatively or in addition, one or more additional or separate anodes can also be used, even if this is not preferred.

The coating device 1 preferably has a coating chamber 7, in which the coating takes place and/or the sputtering sources 3 are arranged.

The coating chamber 7 can be evacuated in a desired way in particular by means of an apparatus 8 that is indicated only schematically in FIG. 1, such as a connection, a vacuum pump, or the like. The apparatus or vacuum pump 8 is especially preferably arranged on the side of the sputtering sources 3 and/or targets 4 facing away from the lenses 2 and/or especially preferably in a center plane M and/or centrally.

The coating device 1 and/or coating chamber 7 preferably has a schematically-indicated gas supply 9, in particular in the form of a gas lance that extends into the coating chamber.

The coating device 1 preferably has a carrier 10 for holding the lenses 2, as indicated in FIG. 1.

Figure 3:
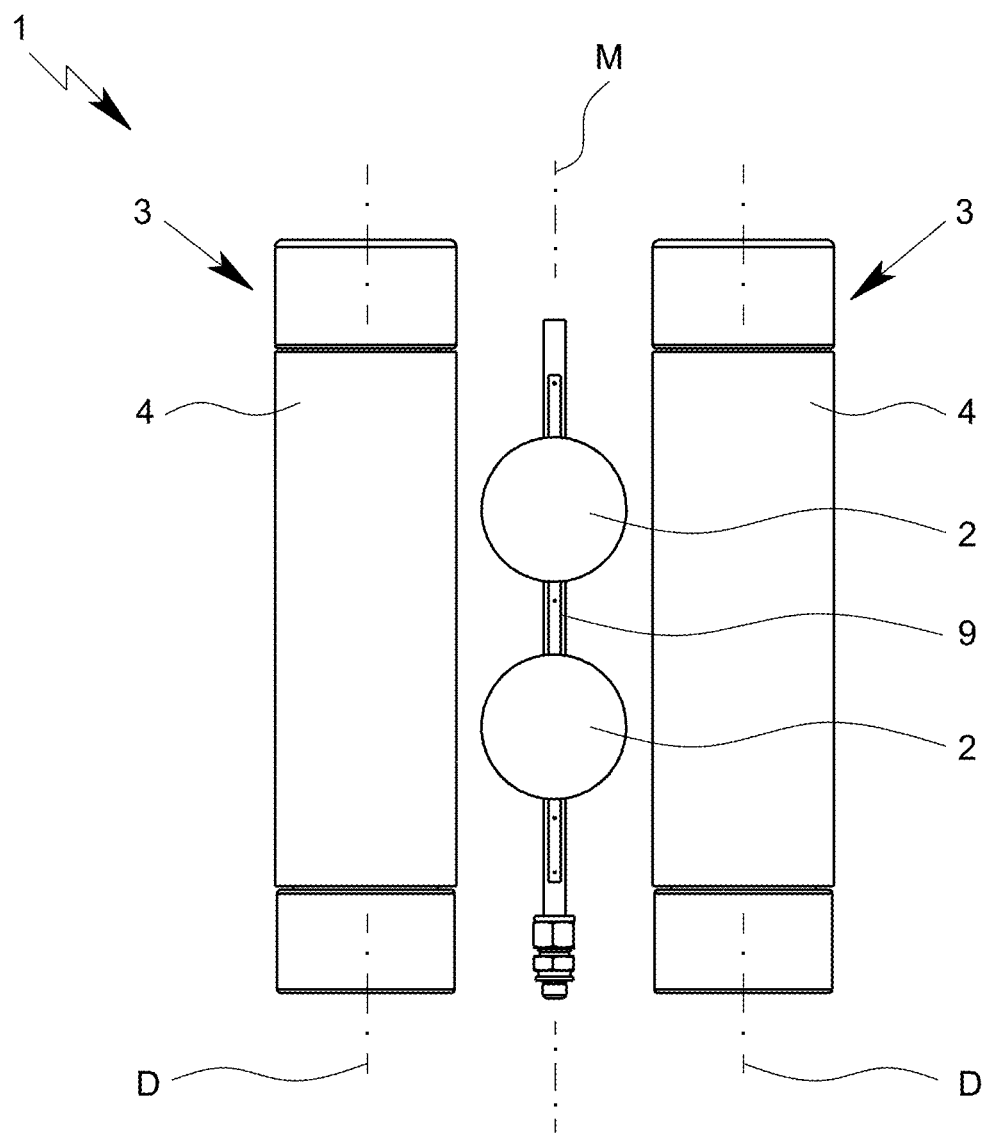
FIG. 3 shows a schematic side view of the coating device corresponding to FIG. 2, but with alternatively-arranged eyeglass lenses.

In FIGS. 2 and 3, the carrier 10 is not depicted for reasons of illustration.

The lenses 2 to be coated preferably each are turnable or rotatable around an axis A. The coating device 1 and/or the carrier 10 is designed for corresponding rotatable holding and in particular for corresponding driving of the lenses 2. In particular, the coating device 1 has a corresponding rotary drive 11, indicated only schematically in FIG. 1, preferably to drive all lenses 2 of the carrier 10 together.

The carrier 10 can preferably be changed together with at least two lenses 2 or all lenses 2 or, here, four lenses 2, which are coated simultaneously in the coating device 1 and/or coating chamber 7.

In particular, the carrier 10 holds the lenses 2 rotatably, in particular around their own and/or different axes A, especially preferably coupled rotatably. Especially preferably, the carrier 10 has a rotary coupling 12, for example via a corresponding gear, as schematically indicated in FIG. 1.

Preferably, the carrier 10 itself is not moved during the coating, but only the lenses 2 held thereon are rotated.

Upon inserting or sliding the carrier 10 into the coating device 1 and/or coating chamber 7, the carrier 10 can preferably be coupled automatically in terms of drive or gear, in particular with the rotary drive 11 or the like, of the coating device 1.

Especially preferably, the carrier holds the lenses 2 or at least their centers of gravity and/or centers at least essentially in one plane, which especially preferably runs parallel to the common plane of the axes of rotation D of the targets 4.

The carrier 10 allows for a fast loading of the coating device 1 and/or coating chamber 7 with the lenses 2 to be coated and/or a fast removal of the coated lenses 2.

The coating chamber 7 can preferably be closed in a gas-tight manner for coating.

The coating device 1 and/or coating chamber 7 can preferably be loaded via an access opening, not depicted, with the lenses 2 to be coated and/or the carrier 10. The access opening can preferably be closed by means of the carrier 10 or by a closure, not depicted, in particular in a gas-tight manner.

The carrier 10 can preferably be used in general in devices for coating lenses 2, in particular, also in the case of coating methods other than sputtering.

The axes of rotation D and/or the longitudinal extensions L of the targets 4 preferably run in a common plane, especially preferably a vertical or horizontal plane.

The lenses 2 are preferably arranged above and/or (only) on one side of the previously-mentioned plane.

Preferably, each lens 2 is arranged over an assigned target 4. The term "over" can refer to the vertical height and/or to the distance relative to the assigned target 4 and/or can denote that the surface of the lens 2 to be coated has at least one surface normal, which intersects the target 4 and especially preferably the axis of rotation D thereof.

Preferably, the lenses 2 are assigned in pairs to a sputtering source 3 and/or a target 4.

In particular, two lenses 2 are arranged over a common target 4, respectively, as indicated in FIG. 2.

Especially preferably, the coating device 1 and/or the carrier 10 is designed for accommodating two pairs of lenses 2, i.e., a total of four lenses 2, wherein two lenses 2 are assigned to a common sputtering source 3 and/or a common target 4, respectively.

The axis A, around which the lens 2 rotates during coating in each case, is preferably stationary or is fixed relative to the target 4 and/or the sputtering source 3 or the axis of rotation D.

In particular, a linear movement and/or a center-of-gravity movement, such as a circular movement, between the sputtering source 3 and/or the target 4 and/or the axes of rotation D, on the one hand, and the lens 2 or lenses 2 to be coated and/or the axes A, on the other hand, is avoided or rendered impossible. This is conducive to an especially simple design.

The (vertical) distance Z of the lens 2 from the assigned target 4 is in FIG. 1 and is preferably fixed. Optionally, an adaption or adjustment of the distance Z of the lens 2 from the assigned target 4 is carried out depending on the diameter and/or the curvature and/or shape of the lens 2 or surface to be coated.

The axes A of two lenses 2 that are assigned to a common target 4 preferably run in a common plane and in particular parallel to one another.

The axes A preferably run transversely or perpendicular to the target plane and/or common plane of the axes of rotation D and/or to the axis of rotation D of the assigned target 4.

The axes A can also be inclined relative to one another in their common plane, in particular toward one another or outward or away from one another.

The axis of rotation A of the lens 2 can also be shifted in a direction transversely to the axis of rotation D in the horizontal direction and/or to the center between the two axes of rotation D of the targets 4, in particular so that an offset or distance V between the lens axis A and the assigned target axis D is formed, as indicated in FIG. 1 for the lens 2 arranged on the right side (the same preferably applies, of course, also for the lens 2 arranged on the left side).

The distance V is preferably fixed. Optionally, an adaption or adjustment of the distance V between the lens axis A and the assigned target axis D is carried out depending on the diameter and/or the curvature and/or shape of the lens 2 or surface to be coated.

The gas supply 9 is preferably arranged below the sputtering sources 3 and/or targets 4 and/or in between, especially preferably in the center plane M of the coating device 1 and/or coating chamber 7.

The gas supply 9 is preferably designed tubular and/or rod-like and/or is provided with gas outlets that are preferably arranged in a series and/or that point upward.

The sputtering cloud S that occurs during coating, i.e., the sputtered target material, is in each case directed at least essentially in a desired direction by means of the already-mentioned magnetic field or the magnet arrangement 5. This main direction H of the expansion of the sputtering cloud S, indicated in dotted lines in FIG. 1, can be influenced, in particular can be established, by corresponding arrangement and/or orientation of the magnet arrangement 5.

In the illustrative example, the main direction H in the sectional plane perpendicular to the axes of rotation D and/or the two targets 4 is preferably inclined to one another and/or by the angle W (starting from a parallel orientation). Preferably, the angle W can be adjusted or adapted, in particular by corresponding adjustment or control of the magnet arrangements 5.

As already mentioned, the main directions H of the two sputtering cloud S can also run parallel to one another and/or perpendicular to the extension plane of the targets 4 and/or plane with the axes of rotation D.

Preferably, the main directions H run vertically upward or contain one such direction component. As an alternative, a horizontal orientation of the main directions H occurs. The arrangement of the lenses 2 and sputtering sources 3 and/or targets 4 must then, of course, be selected accordingly.

Especially preferably, the lenses 2 are coated in pairs, respectively; in particular two pairs of lenses 2 are, respectively, coated simultaneously. In principle, however, it is also possible to coat only one pair of lenses 2 in the coating device 1 according to the proposed solution. To this end, the two lenses then preferably are arranged over a common target 4 and/or between the two targets 4, as shown schematically in FIG. 3 in an alternative arrangement.

In particular, the lenses 2 are coated in a batch operation, thus, not in a continuous method or not continuously. The coating is carried out in particular only in small groups of lenses 2, preferably in groups of individual pairs or multiple pairs of lenses 2, as required, however, also of individual lenses 2 or any numbers of lenses 2.

The lenses 2 preferably rotate centrically around the respective axis A, in particular with respect to the geometric center of the lens 2.

According to a variant embodiment, not depicted, the lenses 2 can optionally also rotate and/or be mounted eccentrically with respect to the axis of rotation A. The eccentricity is in this case preferably less than the radius of the lens 2, if desired also can be greater.

In particular, the axis of rotation A thus intersects the respective lens 2.

The axis A preferably runs perpendicular to the main plane of the respective lens 2.

Each of the lenses 2 can preferably rotate around its own axis A. The lenses 2 are thus rotatable around different axes A.

The axis A preferably runs transversely, optionally perpendicular, to the longitudinal extension and/or axis of rotation D of the assigned target 4.

In particular, the axis of rotation A of the respective lens 2 intersects the assigned target 4, as indicated in FIG. 1, or optionally the longitudinal axis or axis of rotation D of the assigned target 4.

During the coating and/or rotation, the lens 2 preferably always points to the assigned target 4 or the two assigned targets 4 with its side to be coated.

The axis of rotation D of the respective target 4 preferably runs perpendicular to any surface normal or at least one surface normal of the lens 2 or surface to be coated.

The surface normal of the optical or geometric center of the lens 2 can be inclined toward the axis of rotation A and/or axis of rotation D.

The lens centers are preferably arranged symmetrically to the respective target 4 in the longitudinal extension of the target 4.

The lenses 2 to be coated and/or their geometric or optical centers are preferably arranged at least essentially in a common plane, wherein this plane especially preferably runs parallel to the extension plane of the sputtering sources 3 and/or targets 4 and/or axes of rotation D.

Especially preferably, the cathode distance, i.e., the distance of the targets 4 to one another, and/or the distance Z of the lenses 2 from the targets 4 and/or sputtering sources 3, and/or the angle W is/are varied depending on the lenses 2 to be coated, in particular on the surface shape of the lenses 2 to be coated, thus, for example, flat or greatly curved, and/or depending on the extent of the curvature and/or whether it is a concave or convex surface.

Below, first an especially preferred design of the proposed carrier 10 is explained in further detail. The previous statements and explanations, in particular with respect to FIG. 1, preferably apply in a corresponding or complementary manner, even without explicit repetition.

Figure 4:
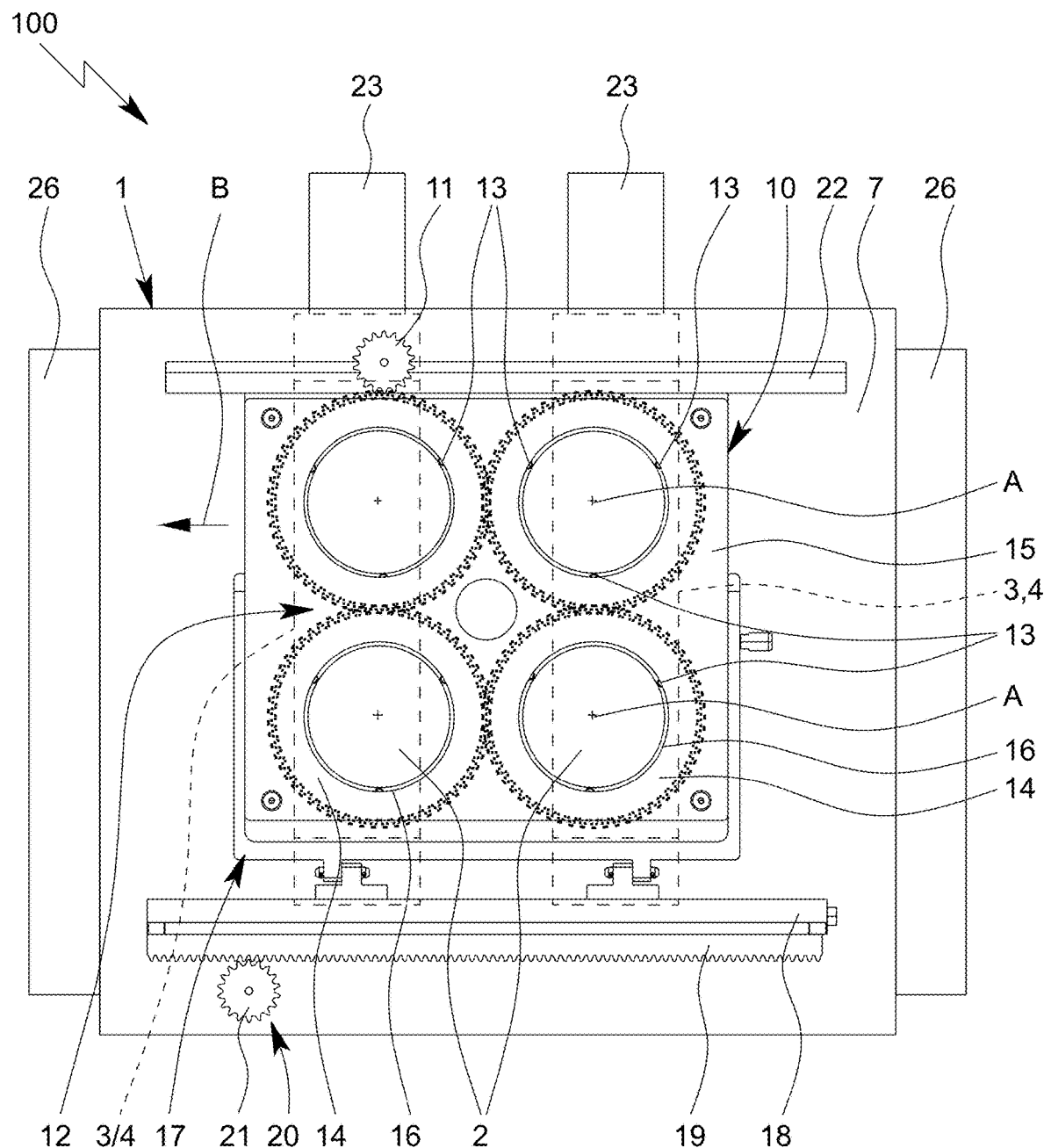
FIG. 4 shows a schematic side view of a detail of a proposed installation and a proposed carrier for holding eyeglass lenses to be coated.

In a schematic side view, FIG. 4 shows a detail of a proposed installation 100 for coating eyeglass lenses 2 and an especially preferred embodiment of the proposed carrier 10 for holding lenses or eyeglass lenses 2 to be coated.

In FIG. 4, in particular a coating device 1 of the installation 100 is depicted almost as a sectional view and/or in an open state, so that the carrier 10 that is in the depicted state located in the coating device 1 can be seen together with lenses 2 held thereon. The coating device 1 is preferably built as already described and/or operates preferably as already described.

The lenses 2, here in particular one or two pairs of lenses 2, are preferably held on the edge side or on the periphery side and/or elastically, in particular by preferably elastic and/or flexible holding elements 13.

The holding elements 13 are prestressed in particular in the radial direction toward the center or lens 2. The holding elements 13 hold the corresponding lens 2 in particular centrically in or under, respectively, an opening 16 of the carrier 10, so that the lens 2 can be coated in the desired way.

Especially preferably, the installation 100 and/or the carrier 10 is designed in such a way that the lenses 2 held by the carrier 10 can be coated from opposite sides or on both sides—in particular without detaching from the carrier 10. The carrier 10 is accordingly preferably open on both sides, in particular flat sides, and/or equipped with openings 16 in order to make possible the two-sided coating of the lenses 2.

In the illustrative example, the holding elements 13 are preferably coupled to a holder and/or bearing element, here a ring element 14. Preferably, the bearing element and/or ring element 14 is rotatable or drivable in a rotating manner. In the illustrative example, the bearing element and/or ring element 14 is embodied in particular as a gearwheel or is coupled to a gearwheel, so that especially preferably, all-here, four-bearing elements and/or ring elements 14 and the assigned lenses 2 can rotate around individual axes A, thus, around different axes A.

In the illustrative example, the rotary coupling 12 is accomplished in particular with the combing engagement of the gearwheels and/or ring elements 14. However, other structural solutions, for example with a gearing mechanism, belt, or the like, are also possible.

The carrier 10 preferably has an in particular plate-like base element 15, in which the holders and/or holding elements 13 for the lenses 2 and in particular also the bearing elements and/or ring elements 14 are integrated.

The base element 15 is preferably covered on both sides and/or equipped with the already-mentioned openings 16, so that the lenses 2 can be coated accordingly.

The carrier 10 can preferably be coupled or is coupled to a carriage or frame 17, as indicated in FIG. 4. The carriage or the frame 17 is used in particular for handling and/or conveying the carrier 10 with the lenses 2 to be coated in the installation 100 and/or through the coating device(s) 1.

In the illustrative example, the frame 17 is preferably designed for clamping and/or force-fit accommodation of the carrier 10 and/or is made fork-like.

The carrier 10 can be coupled or is coupled in particular via the frame 17 preferably with a guide element 18 and/or a toothed rack 19, as indicated schematically in FIG. 4.

In the illustrative example, the guide element 18 is preferably coupled to the frame 17 in an articulated manner, wherein the articulated axis runs in particular in the conveying direction F. However, other structural solutions are also possible.

The guide element 18 preferably carries the toothed rack 19.

In the illustrative example, the toothing of the toothed rack 19 preferably points downward. However, other orientations are also possible here. For example, the toothing can also point to the side or in principle also upward.

The installation 100 and/or the depicted coating device 1 or any coating device 1 preferably has a conveying apparatus 20 for conveying the carrier 10 through the installation 100 and/or into the (respective) coating device 1 and/or out of the latter.

Especially preferably, the carrier 10 together with the lenses 2 to be coated and in particular also together with the carriage or frame 17 is accommodated completely in the respective coating device 1 and/or its coating chamber 7 for coating.

In the illustrative example, the conveying apparatus 20 and/or preferably each coating device 1 preferably comprises a conveying drive 21, which in particular with a corresponding pinion gear or the like engages on or can engage on the carrier 10 and/or frame 17, especially preferably on the toothed rack 19, for—in particular linear-conveying or movement as needed—for example in the schematically indicated conveying direction F. In particular, the conveying drive 21 comprises a stepper motor with the pinion gear.

The carrier 10 is preferably movably or slidably guided on rails 22 in the installation 100 and/or coating device 1, preferably on opposite sides and/or from above and/or below.

Figure 5:
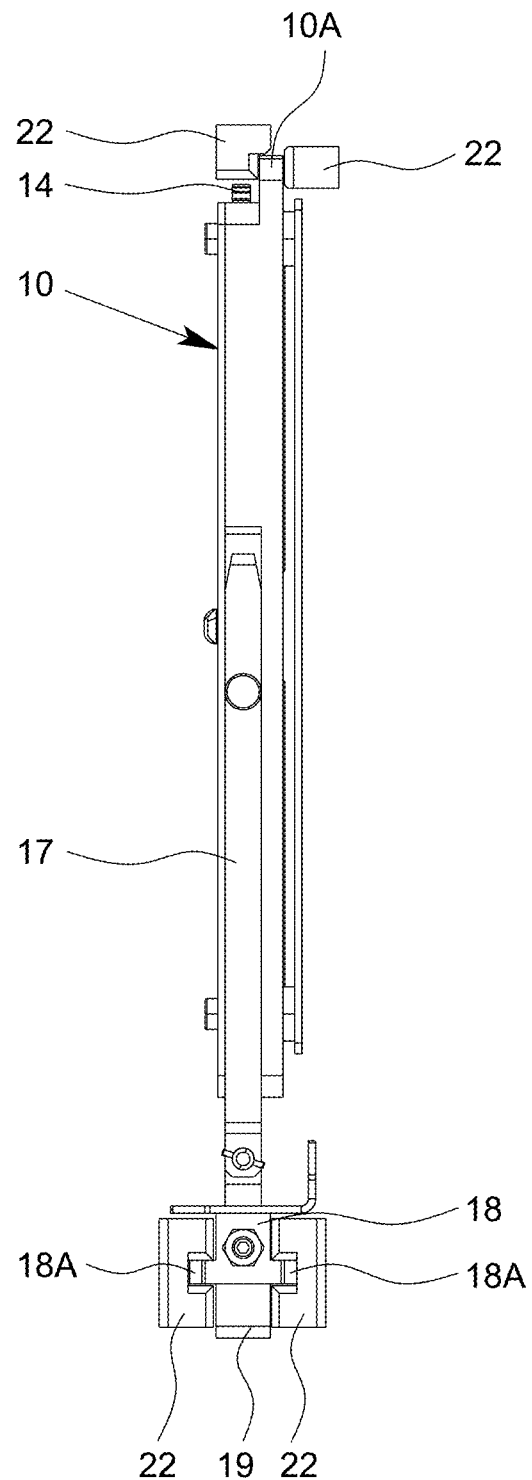
FIG. 5 shows another side view of the carrier of FIG. 4.

In FIG. 4, only an upper rail 22 is shown. FIG. 5 shows—in another side view in the direction of the conveying direction F, i.e., transversely to the longitudinal extension of the rails 22—how the carrier 10, in particular together with the coupled carriage or frame 17, is especially preferably guided on opposite sides and/or from above and/or below by the rails 22 in the illustrative example.

Preferably, the carrier 10 and/or the frame 17 or in particular the guide element 18 is guided laterally and/or vertically—here from below—by one or two rails 22, as schematically indicated in FIG. 5. For example, lateral ribs, projections or arms 18A of the guide element 18 can engage in corresponding grooves in particular of the guide rails 22 that are arranged on opposite sides. Especially preferably, a slip-in guide is thus realized. However, other structural solutions are also possible.

On the other side and/or above, the carrier 10 or a carrier portion 10A that projects upward is guided preferably only laterally by one or two rails 22, as indicated in FIG. 5. Also here, preferably a slip-in guide is realized. However, other structural solutions are also possible.

The carrier 10 can be slid or moved in particular together with the frame 17 or vice versa in the conveying direction F or in the opposite direction.

The conveying apparatus 20 and/or the conveying drive 21 makes possible a desired movement, conveying and/or positioning of the carrier 10 inside the (respective) coating device 1 and/or in the installation 100.

In the illustrative example, an at least essentially vertical orientation of the carrier 10 and/or the lenses 2 (with respect to their main extension planes or flat sides) in the conveying through the installation 1 and/or coating apparatus(es) 1 is preferred in order to make possible as compact a design as possible with a particularly smaller base area. However, other orientations are also possible.

In FIG. 4, the sputtering sources 3 and/or targets 4 of the coating device 1 are schematically arranged in the coating chamber 7. Target drives 23 for rotating the targets 4 are assigned to the targets 4. The target drives 23 are preferably arranged outside of the coating chamber 7, as indicated in FIG. 4. However, other structural solutions are also possible.

The axes of rotation D and/or longitudinal extensions L of the targets 4 preferably run vertically.

The axes of rotation A of the lenses 2 run preferably at least essentially at least essentially horizontal.

In FIG. 4, it is also indicated that the rotary drive 11 of the (respective) coating device 1 is drive-coupled or is engaged in particular with a corresponding gearwheel preferably automatically or inevitably with the carrier 10 and/or the rotary coupling 12 or at least one ring element 14 when the carrier 10 is located in a coating position in the coating device 1. Accordingly, the rotary drive 11 can then set the lenses 2 during coating into the desired rotation around the axes A.

To accomplish the above-mentioned drive engagement, a gearwheel or ring element 14 of the carrier 10 projects laterally—here, upward—in such a way that during sliding or insertion of the carrier 10, the desired drive coupling necessarily is accomplished. However, other structural solutions are also possible here.

Below, based on the schematic depiction of FIG. 6, a first preferred embodiment of the proposed installation 100 for coating lenses 2 is explained, wherein the previous statements and explanations apply in particular correspondingly or in supplementation, even without explicit repetition.

The installation 100 preferably has a receiving station 24 for receiving the lenses 2 to be coated and/or the carriers 10 with the lenses 2 to be coated. In particular, the receiving station 24 is used for a coupling of the carrier 10 with an assigned carriage or frame 17. As an alternative, however, this can also be carried out in advance or separately, provided that a carriage or frame 17 is used at all.

The receiving station 24 can be loaded, for example, manually with carriers 10 and lenses 2. As an alternative, also an automatic receiving and/or loading with carriers 10 and/or lenses 2 can be carried out. For example, the carriers 10 with already-accommodated lenses 2 or other containers with the lenses 2 can be conveyed by an optional conveying system 25, such as a conveyor belt or the like, to the receiving station 24 and in particular can be received in an automated way by the receiving station 24.

If required, the lenses 2 can thus also be accommodated or inserted into the carriers 10 in or at the receiving station 24 manually or in an automated manner.

The receiving station 24 orients the carrier 10 preferably in a desired way, here in particular vertically, if necessary.

It is also possible that the carriers 10 are fed or conveyed with or without lenses 2 already with or in the desired orientation, here in particular with vertical orientation, to the receiving station 24, in particular by the conveying system 25. For example, to this end, the carriers 10 can be conveyed or routed to the receiving station 24 in a type of magazine or transport carriage and/or in layered fashion and/or upright. A very compact design of the installation 100 that requires little space is thus made possible.

Preferably, the carrier 10 together with the lenses 2 to be coated is conveyed or moved exclusively in the preferred orientation through the coating device(s) 1 and/or the entire installation 100. This is conducive in particular to a simple handling and/or compact design.

Figure 6:
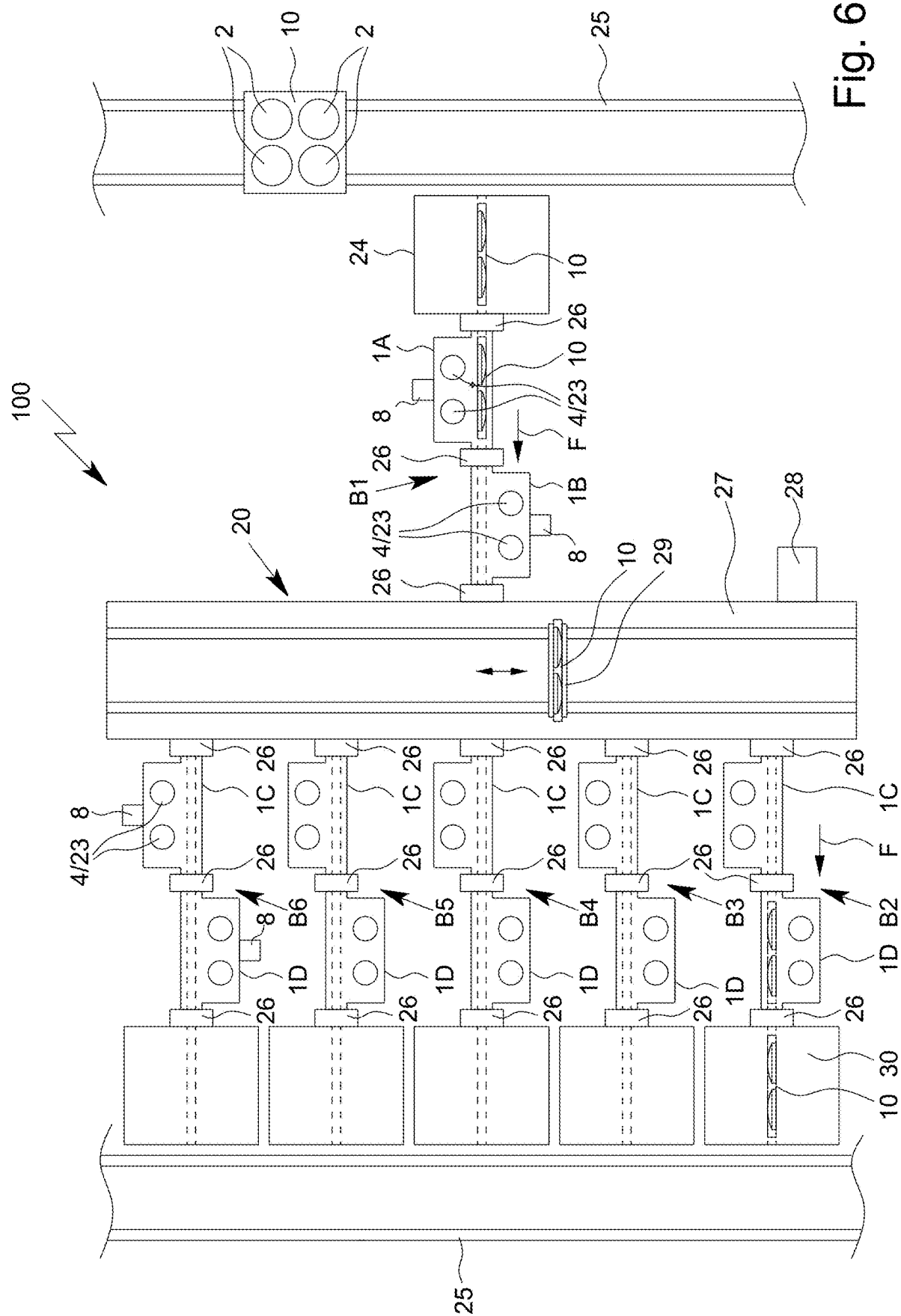
FIG. 6 shows a schematic top view of the proposed installation with multiple coating devices according to a first embodiment.

A (first) coating device 1 adjoins the receiving station 24, which device is referred to with FIG. 1A for easier differentiation in FIG. 6 and is used for applying a first coating.

Another (first) coating device 1B, which is used to apply the first coating on the opposite side of the lenses 2, preferably follows, so that the lenses 2 are then coated on both sides. However, the coating device 1B can also be used to apply another coating.

The two coating devices 1A, 1B preferably form a (first) coating line B, referred to below as B1 for easier differentiation.

In FIG. 6, it is indicated that the target drives 23 of the first coating device 1A, on the one hand, and of the second coating device 1B, on the other hand, and thus also the associated targets 4 are arranged on opposite sides of the carrier 10 and thus the lenses 2, in order to make possible the opposite or two-sided coating of the lenses 2.

Figure 7:
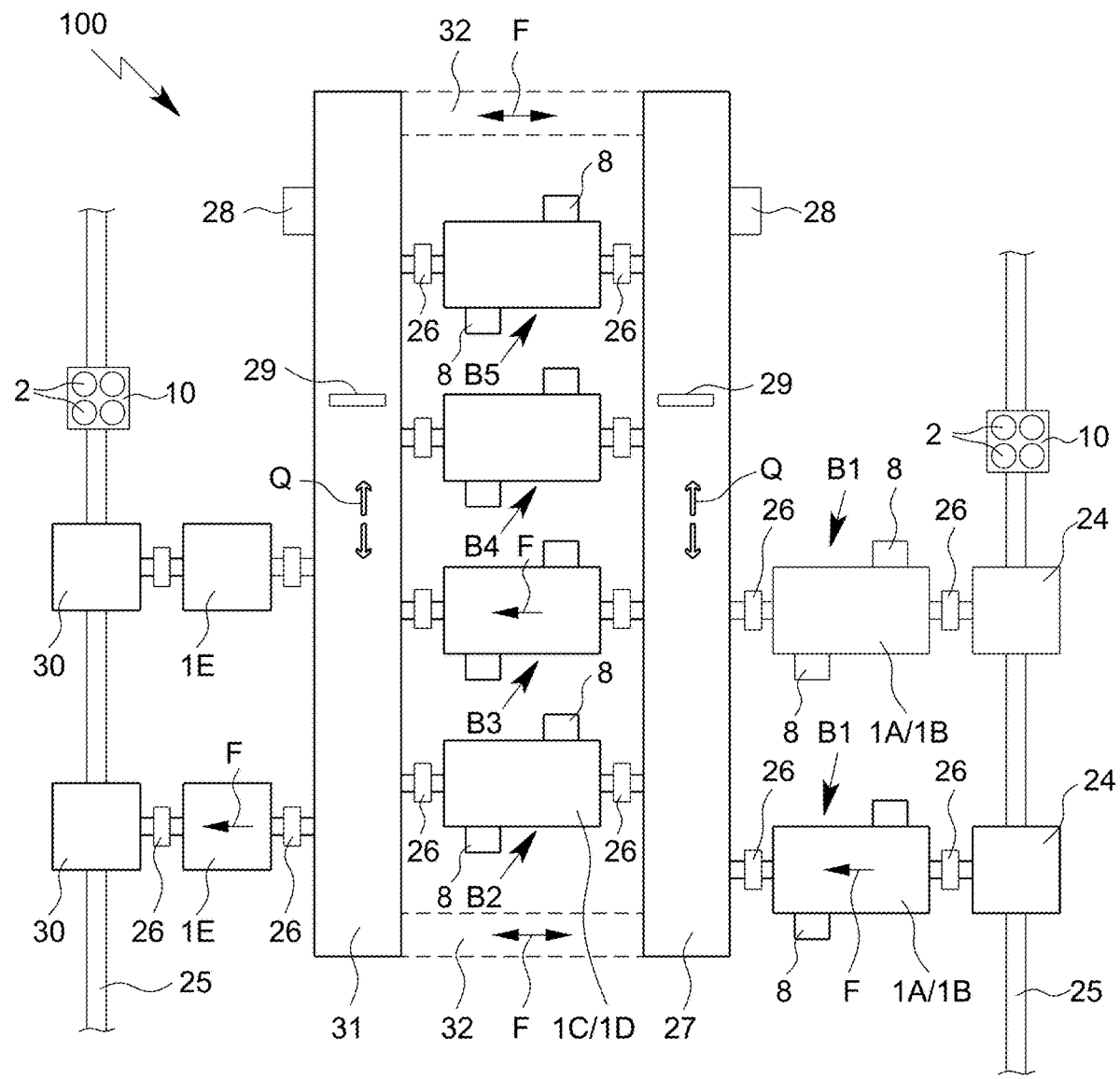
FIG. 7 shows a schematic top view of the proposed installation according to a second embodiment.

It is also possible, however, to combine the two coating devices 1A and 1B in a common housing and/or with a common coating chamber 7 (this is indicated by way of example in the second embodiment that is depicted in FIG. 7).

In FIG. 6, further schematic apparatuses or vacuum pumps 8 are indicated in order to evacuate the coating chambers 7 of the coating devices 1 for the coating.

Preferably, the lenses 2 and/or carriers 10 move through some, multiple, or all coating devices 1 of the installation 100 in particular in a straight line and/or discontinuously or in succession, and/or said devices are loaded via a receiving opening with the lenses 2 and/or carriers 10, wherein the lenses 2 and/or carriers 10 are discharged again via a discharge opening that is separate from the receiving opening. This is in particular conducive to a desired linking of the coating devices 1 and/or coating chambers 7 and/or a successive moving-through or passing-through the different coating devices 1 and/or installation 100.

Preferably, a lock (or airlock or sluice) 26 is upstream and/or downstream from each coating device 1, in order to be able to close the receiving opening, on the one hand, and the discharge opening, on the other hand, in as gas-tight a manner as possible for the coating and in particular to be able to produce a desired vacuum—in particular a high vacuum—for the coating.

Optionally, the receiving station 24 can also already be evacuated or be placed under a pre-vacuum, in particular a low vacuum or medium vacuum, in order to not directly aerate the coating device 1A to normal pressure when the lock 26 to the first coating device 1A is opened, but rather just to keep the coating device 1A to a pressure that is as low as possible or is relatively low.

The carrier 10 is preferably conveyed or moved in a straight line and/or linearly and/or guided on or by rails 22 from the discharging station 24 by means of the conveying apparatus 20, in particular corresponding and/or distributed conveying drives 21, into the first coating device 1A or in general into or through the coating devices 1 and/or through the installation 100.

After the coating in the first coating device 1A, the carrier 10 together with the lenses 2 then coated on one side is further conveyed, preferably again in a straight line and/or linearly and/or by means of corresponding rails 22 and/or by means of the conveying apparatus 20 and/or the conveying drives 21, into the second coating device 1B, in order to coat the lenses 2 there on the other side.

The coating chambers 7 of the coating devices 1A, 1B, thus of the different coating devices 1, are preferably designed separately and/or detachable from one another, in particular in a gas-tight or vacuum-tight manner, here through the lock(s) 26.

The (first) coating line B1 preferably comprises two coating devices 1A, 1B for opposite coating. However, it is also possible that the coating line B1 comprises only one coating device 1, in particular for selective coating of one or two sides. The coating line B1 further comprises preferably also corresponding locks 26, in particular at the beginning and at the end and/or between individual coating devices 1.

Especially preferably, conveying is carried out in such a way that the lenses 2 to be coated are received with the assigned carrier 10 at one end of the coating line B1 and are discharged again at another or opposite end. Alternatively, however, it is also possible to receive the lenses 2 for coating at one end and to discharge them again after the coating on the same end of the coating line B1.

Preferably, the installation 100 has not only a (first) coating device 1A or first coating devices 1A, 1B or coating line B1, but, moreover, further coating devices 1 and/or coating lines B, to which—preferably selectively—the lenses 2 in particular together with the respective carriers 10 can be conveyed or are conveyed.

The first coating devices 1A and 1B are especially preferably designed as sputtering devices, in particular for magnetron sputtering—more especially preferably as described with respect to FIGS. 1 to 3—and/or for one—sided application of a coating, respectively.

The two devices 1A and 1B are preferably equipped for applying a coating from opposite sides to the lens(es) 2 and/or with sputtering sources 3 or targets 4 arranged on opposite sides, in particular with respect to the conveying direction F and/or main plane of the carrier 10 and/or the lenses 2, as indicated schematically in FIG. 6.

The further coating devices 1C and 1D are preferably designed as described above, thus, in particular designed corresponding to or similar to the two coating devices 1A and 1B, and in particular also for applying coatings to opposite sides.

In principle, the two coating devices 1A and 1B, on the one hand, and the two coating devices 1C and 1D, on the other hand, can also be designed differently and/or operate with different coating methods.

The installation 100 and/or conveying apparatus 20 preferably has a transfer chamber 27, in order to accommodate the lenses 2 and/or the carrier 10 with the lenses 2 after applying the first coating—in particular a two-sided basic coating—and to be able to further convey them to the downstream further coating devices 1C, 1D and/or coating lines B2 to B6—in particular under vacuum.

In particular, the additional coating devices 1 and/or coating lines B are connected in parallel to the transfer chamber 27, thus, can be loaded independently of one another with lenses 2 and/or the carriers 10.

The transfer chamber 27 can be evacuated preferably by means of an assigned vacuum pump 28 and/or especially preferably allows a further conveying of the lenses 2 after the coating in the coating device 1A and/or 1B and/or coating line B1 under vacuum or under negative pressure to a downstream or subsequent coating device 1 and/or coating line B, here to one of the coating devices 1C or coating lines B2 to B6.

The conveying apparatus 20 and/or transfer chamber 27 preferably has a conveyor 29 for corresponding handling and/or conveying, in particular transverse conveying of the lenses 2 preferably together with the associated carrier 10. In particular, a conveying in a transverse direction Q, namely transverse or perpendicular to the other primary—in particular linear or straight-line—conveying direction F, is made possible or realized in the installation 100.

After the application or finishing of the (first) coating or the basic coating in the first coating line B1 and/or in the coating device 1B connected to the transfer chamber 27, the lock 26 is opened to the transfer chamber 27, and the lenses 2 are further conveyed preferably together with the carrier 10 into the transfer chamber 27 or are delivered to the latter.

The conveyor 29 then makes possible in particular a conveying or shifting or movement in the transverse direction Q and/or a further conveying, in particular selectively to one of the further coating devices 1C and/or coating lines B2 to B6 connected to the transfer chamber 27.

The further coating devices 1C and/or coating lines B2 to B6 are preferably connected each via a lock (or airlock or sluice) 26 and/or in parallel to the transfer chamber 27, in particular so that also here, the conveying of the lenses 2 and/or carriers 10 is carried out in a conveying direction F, which preferably runs parallel or in extension to the conveying direction F between the receiving station 24 and the transfer chamber 27 and/or in the first coating line B1. However, other structural solutions are also possible.

In the further coating device 1C and a coating device 1D that is preferably in each case connected thereto, a further coating or multiple coatings is/are applied to the lenses 2, preferably again alternating from opposite sides.

The further coating devices 1C and 1D allow in particular an alternating two-sided coating of the lenses 2 and/or are preferably linked (coupled) and/or form a (further) coating line B.

The coating devices 1C and 1D and in particular also a discharge station 30 connecting thereto are preferably in turn arranged in such a way that an at least essentially straight-line and/or linear conveying of the carriers 10 from the transfer chamber 27 through the two coating devices 1C and 1D to the connecting discharge station 30 is made possible. However, other structural solutions or courses are also possible.

Preferably, in each case locks 26 are again arranged before and after and/or between the coating devices 1C and 1D.

In particular, the further coating lines B2 to B6 each comprise a coating device 1C and a subsequent coating device 1D or are formed therefrom.

In particular, locks 26 are arranged between the processing lines B2 to B6, on the one hand to the transfer chamber 27 and on the other hand, respectively, to the assigned discharge station 30.

After the application of the further coating(s)—in particular of single-layer or multi-layer anti-reflection coating layers and/or of one or more mirror coating layers—in the further coating devices 1C, 1D and/or in the further or second coating lines B2 to B6, the lenses 2 in particular together with the assigned carriers 10 are further conveyed or discharged to the respective discharge station 30.

In the discharge station 30, the coated lenses 2 can be either manually removed or in particular discharged in an automated manner to the conveying system 25, such as a conveyor belt or the like.

It is also possible that before the hand-off of the lenses 2 to the discharge station 30, a further or final coating or treatment of the lenses 2, in particular for the so-called surface finish or by applying an end coating, is carried out. This can be carried out, for example, in the further or second or last coating lines B2 to B6 and/or in one or more additional coating devices (see 1E in the case of the second embodiment according to FIG. 7).

As a result, in particular finish-coated lenses or eyeglass lenses 2 can be provided and/or produced by the installation 100.

The discharge station 30 is preferably in turn connected via a lock 26 to the further or last coating device 1D and/or processing line B2 to B6 and/or the vacuum system that is preferably formed by the installation 100, thus, in particular in a comparable manner to the connection of the receiving station 24. Preferably, the discharge station 30 is also placed under negative pressure or vacuum in order to prevent—during the opening of the lock 26—an at least excessive aeration of the coating device 1D and/or increase in the gas pressure in the coating device 1D.

Especially preferably, a linked or connected vacuum system is formed by the installation 100, which system comprises multiple or all coating devices 1 and/or coating chambers 7, if necessary the locks 26, preferably at least one transfer chamber 27, and optionally the receiving station 24 and/or discharge station 30.

Preferably, a continuous vacuum system is thus formed, through which system the lenses 2 to be coated and/or the carriers 10 with the lenses 2 are conveyed.

Preferably, the installation 100 or its vacuum system is kept during operation in general in or under a vacuum, even when the vacuum optionally varies. For example, the coating devices 1, at least the coating devices 1 for sputtering, are placed under a high vacuum for coating-thus in particular with closed locks 26. Other parts of the installation 100 and/or the vacuum system, such as the transfer chamber 27, the receiving station 24 and/or the discharge station 30 and/or other components or connections are preferably placed or evacuated to a lower vacuum, thus, for example, (only) a low vacuum or medium vacuum.

Especially preferably, during the ongoing operation and in particular also when changing lenses 2 and/or carriers 10 at least in some, multiple, or in particular all coating devices 1 of the vacuum system, a specific minimum vacuum, in particular a low vacuum or medium vacuum is maintained or preserved, thus in particular also when the locks 26 are opened. This is conducive in particular to an efficient coating and/or process sequence or operation.

Preferably, the installation 100 has a modular design, so that different coating devices 1 can be combined in particular also with different coating methods, in particular running under vacuum, in the installation 100 and/or in the vacuum system.

Especially preferably, the coating is carried out by gaseous-phase deposition, in particular chemical gaseous-phase deposition (referred to as CVD or vapor-phase deposition) and/or physical gaseous-phase deposition, i.e., physical coating methods, such as PVD, thermal evaporation, sputtering and/or the like.

The proposed installation 100 and the proposed method allow in particular the application of a basic coating on the lenses 2 as a first coating here by means of the coating device(s) 1A, 1B and/or the first coating line B1. The application of this coating lasts a relatively short time.

Later, in the further coating devices 1C, 1D and/or further/second coating lines B2 to B6, preferably further coatings are then applied. In this case, the lenses 2, if necessary, also can be changed multiple times, respectively, between the two coating devices 1C and 1D, and/or different gases and/or targets can be used during coating. Accordingly, this second coating—for example in the construction of a layer package for anti-reflection coating and/or for applying multiple antireflection layers and/or a mirror coating—lasts significantly longer than the application of the first coating or basic coating.

With respect to a good throughput of the installation 100, therefore preferably essentially further or second coating lines B2 to B6 are provided than first coating lines B1, in particular more than twice as many.

In particular, the installation 100 and/or the conveying apparatus 20 and/or the conveyor 29 can in each case selectively feed or convey—especially preferably depending on the availability, technical configuration, and/or the respective requirements—the lenses 2 to be (further) coated selectively to one of the further or second coating lines B2 to B6.

Below, based on FIG. 7, a second embodiment of the proposed installation 100 and the proposed method is explained in further detail, wherein in particular, primarily differences compared to the first embodiment are emphasized, and in particular the previous statements and explanations for the first embodiment and also for the generally preferred design of the coating device 1 apply correspondingly or in supplementation.

In the second embodiment, the coating devices 1A and 1B and/or 1C and 1D, which each allow a coating of the lenses 2 from opposite sides and/or form a coating line B, can be embodied in pairs as a structural unit and/or can be equipped with a common housing.

In the second embodiment, the installation 100 preferably has two or more first processing lines B1, which preferably independently of one another can be equipped or loaded with the lenses 2 to be coated, in particular via corresponding separate receiving stations 24 with the lenses 2 to be coated and associated carriers 10.

The coating lines B1 are preferably connected in parallel to the downstream transfer chamber 27, in particular to be able to convey the coated lenses 2 then selectively further to one of the second or further coating lines B2 to B5.

Preferably, an additional transfer chamber 31 is connected to the second coating lines B2 to B5, which chamber is preferably designed as the transfer chamber 27 and/or is used in particular in a selective further conveying of the coated lenses 2 to one or more additional devices, in particular coating devices 1E.

Preferably, the coating lines B2 to B5 each are connected via locks (or airlocks or sluices) 26 to the upstream transfer chamber 27 and/or the downstream transfer chamber 31.

In general, it can be noted that preferably all locks 26 can be closed individually in order to separate individual spaces and in particular the coating chambers 7 of the coating devices 1 as required and in particular to place them under vacuum, preferably high vacuum, for the respective coating, which is carried out in particular by so-called gaseous-phase deposition, especially preferably by sputtering.

The two transfer chambers 27, 31 are optionally connected by one or two conveying connections 32, as indicated in dotted lines in FIG. 7, in particular to make possible backward conveying and/or circular conveying and/or bypassing of the second coating lines B2 to B5. The conveying connections 32 can preferably also be evacuated like the transfer chambers 27, 31, are in particular connect to the latter in a corresponding gas-tight manner, and form a part of the proposed vacuum system of the installation 100.

The optional conveying connections 32 preferably allow an additional conveying in parallel to the normal conveying F of the lenses 2, selectively also in the opposite direction.

The conveying connections 32 are preferably equipped with corresponding conveyors 29 (not depicted).

In particular, by means of at least one conveying connection 32, it is possible that the lenses 2 and/or the carriers 10 with the lenses 2 are transported back again to the transfer chamber 27 via the transfer chamber 31 and the conveying connection 32 after passing through one of the further coating lines B2 to B5 in order to then selectively again pass through the same coating line B2 to B5 or another coating line B2 to B5.

Alternatively or in addition, the lenses 2 and/or carriers 10 in principle can also, if necessary, preferably directly be changed or moved forward and backward in one or each coating line B, especially preferably in the further coating lines B2 to B5, between the individual coating devices, here in particular 1C and 1D, in order to make possible in particular an optimal sequence when applying multiple layers.

It is to be noted that the second coating in the second or further coating lines B2 to B5 often involves the application of about 10 or more layers, so that this coating often lasts more than two or three times as long as the application of the first coating or basic coating. Accordingly, then preferably also correspondingly more second coating lines B2 to B5 than first coating lines B1 are provided.

The conveying apparatus 20 and/or transfer chamber 27 is optionally also designed for intermediate storage of lenses 2 and/or carriers 10 with lenses 2 after the first coating or basic coating is applied and/or after the first coating line B1 is left. To this end, in particular the transfer chamber 27 or its conveyor 29 can be designed accordingly, for example to accommodate multiple lenses 2 or carriers 10, by making available additional conveying elements, and/or by making available storage spaces, storage areas, and/or magazines, which then preferably also are integrated into the vacuum system.

For the above-mentioned intermediate storage, as an alternative or in a complementary manner, the additional transfer chamber 31 can be used via a conveying connection 32, and/or especially preferably, the already-mentioned ring conveying or circular conveying of lenses 2 and/or carriers 10 with lenses 2 can be used by the additional conveying connections 32 in combination with the transfer chambers 27 and 31 or similar configurations.

The installation 100 preferably has one or more additional coating devices 1E for further and/or downstream surface treatment and/or surface coating of the lenses 2.

In particular, two or more additional coating devices 1E are connected in parallel to the additional transfer chamber 31, as indicated in FIG. 7, or alternatively to the transfer chamber 27, especially preferably in each case in turn via locks 26. Thus, by the additional coating devices 1E, an additional surface treatment and/or coating of the lenses 2 is made possible—in particular the already-mentioned surface finish and/or application of a protective layer.

The transfer chamber 31 can optionally in turn be used as an intermediate storage of lenses 2 and/or carriers 10 with lenses 2 for further conveying to the one or more additional coating devices 1E. As an alternative or in addition, a corresponding intermediate storage can also be carried out by the already-mentioned circular conveying or ring conveying in the coupling of the two transfer chambers 27 and 31 via two conveying connections 32.

In general, it is to be noted that the intermediate storage can also already be achieved or improved with a coupling of the two transfer chambers 27 and 31 via a single conveying connection 32, in particular when the conveying connection 32 makes possible any desired changing of the lenses 2 and/or carriers 10 from the transfer chamber 27 into the transfer chamber 31 and vice versa.

Finally, the finish-coated or treated lenses 2—here preferably directly from the additional devices 1E—are handed off in particular in each case to a separate discharge station 30.

In the second embodiment, it is schematically indicated that the conveying system 25 or a conveyor belt or the like can also be guided through the receiving stations 24 and/or discharge stations 30.

In general, it is to be noted that the coating devices 1 in principle can be structured and/or equipped at least essentially identical, but if required also differently. For example, in particular also coating devices 1 that are structured differently or that operate in different ways can be used for different coating lines B.

Especially preferably, the coating of the lenses 2 in the coating devices 1A to 1D and/or coating lines B is carried out by sputtering, in particular magnetron sputtering, as already explained in particular based on FIGS. 1 to 3 by way of example for a coating device 1. The coating devices 1A to 1D of the installation 100 are structured in particular in this preferred way. However, coating devices that are structured differently can also be used and/or combined.

The additional coating devices 1E coat the lenses 2 preferably not by sputtering or cathode sputtering, but rather in particular by thermal evaporation, CVD, PVD, or the like.

Optionally, the additional coating devices 1E can also be integrated into the further coating lines B2 to B5 and/or into one of the further coating devices 1C, 1D. In this case, if necessary, the additional transfer chamber 31 can be omitted, even when the latter is useful with respect to a possible reduction of the otherwise necessary number of discharge stations 30 or is used despite this.

The present invention, the proposed installation 100 and the proposed method especially preferably relate to the coating of lenses 2 in a vacuum, preferably by gaseous-phase deposition, in particular sputtering, especially preferably magnetron sputtering. Preferably, at least a few layers, in particular the first layer and/or the second layer, are applied by gaseous-phase deposition, in particular sputtering, especially preferably magnetron sputtering, on the lenses 2 with the proposed installation 100 and/or the proposed method.

The lenses or eyeglass lenses 2 have—preferably curved or domed, in particular concave or convex-surfaces or flat sides, which are coated. The present invention and/or the proposed installation 100 and the proposed method relate in particular only to the coating of such curved or domed surfaces of lenses or eyeglass lenses 2. Here, in particular, the highest accuracy and especially uniform forming of the respective layers are important.

Especially preferably, beginning with the receiving station 24 up to the hand-off of the then coated lens 2 to the discharge station 30, the lens 2 is continuously held in a vacuum or vacuum system, even when the vacuum can vary—in particular during operation, by opening and closing the locks 26 and/or spatially depending on the respective area of the installation 100—for example can also be different in the coating devices 1 and/or locks 26 and/or transfer chambers 27, 31 and/or additional devices 1E, and/or different gases can be added or used locally.

During or for coating, single or multiple coating devices 1, in particular at least the coating devices 1A and 1B, and/or the first coating line B1 and/or the coating devices 1C and 1D and/or second coating lines B2 to B5 and/or their coating chamber(s) 7 are preferably evacuated to a pressure of below 0.1 Pa, or a high vacuum is applied or generated there. The same preferably also applies for the additional coating devices 1E. However, depending on the requirement, the latter can, if applicable, also operate at a somewhat higher pressure or in a "lower" vacuum, thus, for example, in a medium vacuum.

The pressure in the rest of the installation 100 and/or in the transfer chamber 27 and/or 31 and/or in the additional conveying connection 32 and/or in the receiving station 24 and/or discharge station 30 is preferably somewhat higher than in the coating devices 1 and/or is in particular below 1,000 Pa and/or above 0.1 Pa. In particular, a vacuum is thus also applied or generated there, in particular a low vacuum or medium vacuum.

The proposed installation 100 and the proposed method as well as the proposed carrier 10 allow in particular an individual or adapted coating of small groups of lenses 2, in particular of, respectively, two or four lenses 2, wherein a good high throughput is made possible by the selective distribution to different coating lines B and/or coating devices 1.

In particular, the lenses 2 are coated in a batch operation, thus not in a continuous method or not continuously, wherein the coating is carried out in particular only in small groups of lenses 2, preferably in groups of individual pairs or multiple pairs of lenses 2, if necessary, however, also of individual lenses or any number of lenses 2, especially preferably of fewer than 10 lenses 2.

The proposed installation 100 and/or the proposed method is preferably used for application of one or more anti-reflective layers.

According to the proposed solution, in particular also a reactive coating is carried out, wherein by corresponding feeding of reactive gas, for example of nitrogen, hydrogen, and/or oxygen, to working gas (noble gas), in particular argon, the target material can react therewith and form a desired coating on the lens 2.

The conveying apparatus 20 of the installation 100 preferably comprises the decentralized and/or distributed conveying drives 21, transfer chamber(s) 27, 31, and/or conveyors 29.

The conveying drives 21 are arranged in particular in or at the coating devices 1, coating chambers 7, coating lines B, locks 26, transfer chambers 27, 31, conveyors 29, receiving stations 24 and/or discharge stations 30, in order to make possible the desired conveying of the carriers 10.

In general, it is to be noted that the second coating or anti-reflective coating is preferably built up or composed of a single layer or of a multi-layer stack of dielectric materials. In particular, multi-layer coatings comprising layers with a high refraction index and layers with a lower refraction index are provided. The materials of the individual layers of the layer stack are normally ceramic materials, which are transparent at least in the visible spectral range. In particular, to this end, various oxides or mixed oxides are used. The thickness of these layers is in general between 10 and 100 nm. The total thickness of an anti-reflective layer stack is in general between 100 and 1,000 nm.

The preferred vacuum system and/or the preferred linking of all process steps necessary for the eyeglass lens coating in one installation and/or one vacuum system results in particular in that no individual steps or intermediate steps are carried out in the atmosphere. In this way, an especially efficient process is made possible, wherein in particular, however, undesirable soiling or the like can also be avoided.

Individual aspects and features of the different embodiments and variants can also be combined with one another as desired, but can also be implemented independently of one another.

What is claimed is:

1. Installation for coating eyeglass lenses, comprising:
   a plurality of coating devices for coating eyeglass lenses in a vacuum by means of gaseous-phase deposition;
   a conveying apparatus for conveying eyeglass lenses or a carrier with eyeglass lenses from a coating device to another coating device;
   a plurality of coating lines, each coating line being formed by at least two successive coating devices of the plurality of coating devices; and
   a transfer chamber,
   wherein at least two coating lines are connected in parallel to the transfer chamber and wherein the transfer chamber is designed for further conveying of the eyeglass lenses selectively to one of the at least two parallel connected coating lines,
   wherein the plurality of coating devices, including the coating devices of the at least two parallel connected coating lines, have separate coating chambers, wherein the coating chambers and the transfer chamber form a continuous or interconnecting vacuum system, and
   wherein the coating lines differ from each other in a manner such that each of the coating lines coats eyeglass lenses differently as a function of at least one of eyeglass lens size, eyeglass lens shape, or eyeglass lens surface curvature of the eyeglass lenses to be coated.

2. Installation according to claim 1, wherein the coating chambers are separated or separable from one another and/or from the transfer chamber by means of locks, and wherein the gaseous phase deposition is sputtering.

3. Installation according to claim 1, wherein the installation and/or conveying apparatus is designed for discontinuous and/or linear conveying of eyeglass lenses from a coating device into another coating device.

4. Installation according to claim 1, wherein each coating device has its own conveying drive for further conveying of the eyeglass lenses to another coating device or the transfer chamber.

5. Installation for coating eyeglass lenses, according to claim 1, further comprising a carrier for holding the eyeglass lenses to be coated, wherein the coating devices have separate coating chambers and/or are separated or separable from one another by means of locks.

6. Installation according to claim 5, wherein the installation and/or conveying apparatus has a transfer chamber with an assigned vacuum pump, and wherein the carrier can be conveyed out of a coating device through the transfer chamber into another coating device.

7. Installation according to claim 5, wherein each coating device has its own conveying drive for linear conveying, receiving and/or further conveying of the carrier.

8. Installation according to claim 1, wherein the carrier with the eyeglass lenses can be accommodated in the respective coating device for coating.

9. Installation according to claim 1, wherein the carrier is designed for holding the eyeglass lenses in a rotatable manner around their own axes.

10. Installation according to claim 1, wherein the carrier holds the eyeglass lenses with stationary center of gravity and/or in a centrically rotatable manner.

11. Installation according to claim 1, wherein the installation and/or the carrier is designed for two-sided coating of eyeglass lenses.

12. Installation according to claim 1, wherein the installation and/or conveying apparatus is designed for discontinuous and/or linear conveying of the carrier out of a coating device into another coating device.

13. Installation according to claim 1, wherein the installation and/or conveying apparatus has a carriage or a frame for receiving and holding the carrier and/or for conveying the carrier from or to a coating device.

14. Installation according to claim 1, wherein the installation and/or conveying apparatus moveably guides the carrier, together with a frame, on opposite sides and/or by means of rails.

15. Installation according to claim 1, wherein the carrier can be conveyed with the same and/or a vertical orientation through multiple or all coating devices.

16. Installation according to claim 1, wherein multiple or all coating devices each have their own rotary drive for rotation of the eyeglass lenses to be coated.

17. Installation according to claim 1, wherein the installation is designed in so that upon insertion or sliding into the coating device and/or the coating chamber thereof, the carrier is drive-coupled or gear-coupled automatically to a rotary drive of the coating device.

18. Installation according to claim 1, wherein the installation has coating devices that operate in different ways for different coating methods and/or at least one device for surface finishing.

19. Installation according to claim 1, wherein the conveying apparatus or transfer chamber is designed for further conveying of the eyeglass lenses selectively to different coating devices or coating lines.

20. Installation according to claim 1, wherein the installation is designed for coating the eyeglass lenses in groups, respectively, of one to 10 eyeglass lenses.

21. Installation according to claim 20, wherein the groups are coated in succession in different coating devices.

22. Installation according to claim 1, wherein the installation is designed for accommodating multiple groups of eyeglass lenses and/or carriers.

23. Installation according to claim 1, wherein the installation is designed so that the eyeglass lenses are differently coated individually depending on a convex or concave curvature of their surface(s) to be coated and/or depending on the curvature of the surface(s) to be coated, and/or are conveyed to different coating devices and/or that the coating devices or coating parameters are adapted accordingly.

24. Installation according to claim 1, wherein a conveying system is assigned to the installation or forms a part of the installation in order to load the installation and/or its vacuum system in an automated manner with eyeglass lenses to be coated and/or carriers with eyeglass lenses to be coated, and/or in order to convey away coated eyeglass lenses and/or carriers with coated eyeglass lenses in an automated manner to further convey to another processing apparatus.

25. Installation according to claim 1, wherein the transfer chamber is arranged such that the conveying direction through the transfer chamber is transverse to an otherwise primary, linear conveying direction in the installation or in the coating chambers.

26. Installation according to claim 1, wherein multiple or all coating devices each have their own rotary drive for rotation of the eyeglass lenses to be coated.

27. Installation according to claim 1, wherein the coating devices or different lines of coating devices are loaded independently of one another with the eyeglass lenses or the carrier.

28. Installation according to claim 1, wherein the transfer chamber comprises a conveyor for further conveying of the eyeglass lenses in the transfer chamber selectively to one of the at least two parallel connected coating devices.

29. Installation according to claim 1, wherein the carrier is designed for holding the eyeglass lenses respectively in a rotatable manner, wherein each eyeglass lens is rotatable around an own axis intersecting the respective eyeglass lens.

30. Installation according to claim 1, wherein the carrier is designed for periphery-side and/or elastic holding of eyeglass lenses.

31. Installation according to claim 1, wherein the carrier has a rotary coupling which is freely-accessible from an edge, wherein the rotary coupling is a projecting gearwheel or a ring element.

32. Installation according to claim 1, wherein the carrier has ring elements for holding the eyeglass lenses in a rotatable manner.

33. Installation for coating eyeglass lenses, comprising:
a plurality of coating devices for coating eyeglass lenses in a vacuum by means of gaseous-phase deposition;
a carrier for holding the eyeglass lenses; and
a conveying apparatus for conveying the carrier with eyeglass lenses from a coating device to another coating device;
wherein the plurality of coating devices have separate coating chambers which are separated or separable from one another by means of locks, wherein the coating chambers form a continuous or interconnecting vacuum system,
wherein all coating devices each have their own rotary drive for rotation of the eyeglass lenses to be coated,
wherein the carrier has ring elements for holding the eyeglass lenses, each ring element being embodied as or coupled to a respective gearwheel, each ring element being rotatable around its respective center axis,
wherein the carrier has a rotary coupling that has a gearwheel,
wherein the rotary drive of a respective coating device is engaged with the rotary coupling of the carrier automatically when the carrier is located in a coating position in the coating device, the gearwheel of the rotary coupling being designed and arranged in such a way that during insertion of the carrier into the coating device, the engagement is necessarily accomplished,
wherein rotation of the rotary drive causes rotation of the ring elements together with the eyeglass lenses held by the ring elements so that each eyeglass lens rotates around an own axis intersecting the respective eyeglass lens.

34. Installation according to claim 33, the installation further comprising a transfer chamber, wherein at least two coating devices are connected in parallel to the transfer chamber and wherein the transfer chamber is designed for further conveying of the eyeglass lenses selectively to one of the at least two parallel connected coating devices.

35. Installation according to claim 33, further comprising a transfer chamber and a plurality of coating lines, each coating line being formed by at least two successive coating devices of the plurality of coating devices; and a transfer chamber,
wherein at least two coating lines are connected in parallel to the transfer chamber and wherein the transfer chamber is designed for further conveying of the eyeglass lenses selectively to one of the at least two parallel connected coating lines,
wherein the plurality of coating devices, including the coating devices of the at least two parallel connected coating lines, have separate coating chambers, wherein the coating chambers and the transfer chamber form a continuous or interconnecting vacuum system, and
wherein the coating lines differ from each other so that depending on the selected coating line, the eyeglass lenses are differently coated individually specifically and/or depending on at least one of a size of the eyeglass lenses, a shape of the eyeglass lenses, or a curvature of surfaces of the eyeglass lenses to be coated.

36. Installation according to claim 33, wherein the carrier holds the eyeglass lenses with stationary center of gravity and/or in a centrically rotatable manner.

37. Installation according to claim 33, wherein the installation and/or the carrier is designed for two-sided coating of eyeglass lenses.

38. Installation according to claim 33, wherein the carrier is designed for periphery-side and/or elastic holding of eyeglass lenses.

39. Installation according to claim 33, wherein the installation and/or conveying apparatus is designed for discontinuous and/or linear conveying of the carrier out of a coating device into another coating device.

40. Installation according to claim 33, wherein the installation and/or conveying apparatus has a carriage or a frame for receiving and holding the carrier and/or for conveying the carrier from or to a coating device.

41. Installation according to claim 33, wherein the installation and/or conveying apparatus moveably guides the carrier, together with a frame, on opposite sides and/or by means of rails.

42. Installation according to claim 33, wherein the carrier can be conveyed with the same and/or a vertical orientation through multiple or all coating devices.

43. Installation according to claim 33, wherein the installation is designed for accommodating multiple groups of eyeglass lenses and/or carriers.

44. Installation according to claim 33, wherein the installation is designed so that the eyeglass lenses are differently coated individually specifically and/or depending on a convex or concave curvature of their surface(s) to be coated and/or depending on the curvature of the surface(s) to be coated, and/or are conveyed to different coating devices and/or that the coating devices or coating parameters are adapted accordingly.

45. Installation for coating eyeglass lenses, comprising:
a plurality of coating devices for coating eyeglass lenses in a vacuum by means of gaseous-phase deposition;
a conveying apparatus for conveying eyeglass lenses or a carrier with eyeglass lenses from a coating device to another coating device;
a plurality of coating lines, each coating line being formed by at least two successive coating devices of the plurality of coating devices; and
a transfer chamber,
wherein at least two coating lines are connected in parallel to the transfer chamber and wherein the transfer chamber is designed for further conveying of the eyeglass lenses selectively to one of the at least two parallel connected coating lines,
wherein the plurality of coating devices, including the coating devices of the at least two parallel connected coating lines, have separate coating chambers, wherein the coating chambers and the transfer chamber form a continuous or interconnecting vacuum system, and
wherein one of the at least two coating lines is a coating line for producing a multi-layer antireflection coating, wherein different coating devices of the coating line are for producing different layers of the multi-layer anti-reflection coating.

46. Installation according to claim 45, wherein the at least two parallel connected coating lines differ from each other in a manner such that each of the coating lines coats eyeglass lenses differently, namely a first coating line being the coating line for producing the anti-reflection coating and a second coating line being a coating line for producing a mirror coating.

47. Installation according to claim 45, wherein a further coating line is provided for producing a surface finish.

* * * * *